United States Patent [19]

Mika

[11] Patent Number: 4,919,752

[45] Date of Patent: Apr. 24, 1990

[54] BATH SOLUTION AND PROCESS FOR THE REMOVAL OF LEAD/TIM, LEAD OR TIN COATINGS FROM COPPER OR NICKEL SURFACES

[75] Inventor: Gunter Mika, Geldern, Fed. Rep. of Germany

[73] Assignee: Kollmorgen Corporation, Simsbury, Conn.

[21] Appl. No.: 269,582

[22] Filed: Nov. 10, 1988

[30] Foreign Application Priority Data

Nov. 11, 1987 [DE] Fed. Rep. of Germany ....... 3738307

[51] Int. Cl.$^5$ ............................ C23F 1/00; B44C 1/22; C03C 15/00; C03C 25/06
[52] U.S. Cl. .................................. 156/656; 156/664; 252/79.4
[58] Field of Search ..................... 252/79.2, 79.4, 142, 252/146; 156/565, 664; 134/3, 41

[56] References Cited

U.S. PATENT DOCUMENTS

| | | | |
|---|---|---|---|
| 3,922,229 | 11/1975 | Fishaber et al. | 252/79.4 |
| 4,297,257 | 10/1981 | Elias et al. | 252/79.4 X |
| 4,397,753 | 8/1983 | Czaja | 252/79.4 X |
| 4,713,144 | 12/1987 | Schiller | 252/79.4 X |

FOREIGN PATENT DOCUMENTS 889571 2/1962 United Kingdom .

OTHER PUBLICATIONS

*Stripping Solution For Tin and Tin Alloys*, Chemical Abstracts, Band 99, No. 10, at 5 (Sep. 1983).

Primary Examiner—William A. Powell
Attorney, Agent, or Firm—Morgan & Finnegan

[57] ABSTRACT

The invention relates to a stripping solution for the removal of lead/tin, lead or tin coatings applied to copper or nickel surfaces. The caustic solution consists of nitric acid and contains one or several inhibitor(s) such as block copolymers of propylene oxide and ethylene oxide, or polyethylene glycols, and/or polyols with a molecular weight in excess of 2000.

12 Claims, No Drawings

BATH SOLUTION AND PROCESS FOR THE REMOVAL OF LEAD/TIM, LEAD OR TIN COATINGS FROM COPPER OR NICKEL SURFACES

BACKGROUND OF THE INVENTION

Solutions and methods for completely or partly removing lead, tin, or lead/tin coatings from the surface of another metal such as, for example, copper or nickel, such coatings having been deposited on such surfaces in an earlier process step, are needed, for example in the manufacture of printed wiring boards.

According to a known process, such an electrochemically deposited coating, the latter conforming to the desired conductor pattern, serves as the etch resist.

According to another known process, a tin/lead coating is applied by the hot air levelling process. As a rule, the etch resist layer is subsequently removed again prior to the application of a solder resist mask.

For removing the etch resist, it has been proposed earlier to use solutions based on peroxide and containing inorganic acids such as hydrofluoric acid, fluoboric acid, or nitric acid. Furthermore, the use of peroxide-free solutions has been proposed, i.e., solutions containing, for example, thiourea, hydroxyphenols, alkali salts of m-nitrobenzosulfonic acid, or mixtures of fluoboric acid, hydrofluoric acid and nitric acid.

The solutions according to the state of the art have the serious drawback that they act on copper or nickel, which means they also remove material of the conductor track and costly process controls are required for keeping such removal, which is basically undesirable, as low as possible. In addition, the life of the known solutions is very limited, and they are unsatisfactory, economically speaking. Additional drawbacks include a highly exothermic reaction, as well as corrosion of the insulating and basic materials.

SUMMARY OF THE INVENTION

The objective of the present invention is the preparation of solutions and development of methods for economically removing lead/tin, lead or tin coatings applied to nickel or copper surfaces.

Said objective is accomplished by means of an aqueous stripping solution containing nitric acid and one or more inhibitor(s) selected from the group of block copolymers of propylene oxide and ethylene oxide, fluorocarbon surfactants, polyethylene glycols with a molecular weight of more than 2000, and polyols. Beneficial additional features are specified below. According to the invention, it is surprisingly possible to practically avoid in a complete way attack on nickel and copper by adding an inhibitor to the stripping medium. The solutions according to the invention are stable; they do not require any special process controls; and they permit the complete removal of the etch resist coating in a reliable and economical manner.

According to the invention, nitric acid is used as the stripping medium for the lead/tin, lead or tin coating. Block copolymers of propylene oxide and ethylene oxide, fluorocarbon surfactants polyethylene glycols with a molecular weight in excess of 2000, and polyols are suitable inhibitors according to the invention. It has been found that block copolymers of propylene oxide and ethylene oxide of the type series L31 ® (molecular weight of 1000 and 10% ethylene oxide) to F127 ® (molecular weight of 12,700 and 70% ethylene oxide), P103 ® (molecular weight of 4950 and 30% ethylene oxide), L44 ® (molecular weight of 2200 and 40% ethylene oxide) and L61 ® (molecular weight of 2000 and 10% ethylene oxide) of BASF Wyandotte Chemicals, polyols and FC 95 ® of the 3M Company, as well as polyethylene glycol with a molecular weight of 8000, are particularly suitable. Polyethylene glycol with a molecular weight of up to 2000 does not exhibit any protective effects.

The stripping solution preferred according to the invention contains from 20 to 40% by weight nitric acid, and from 0.02 to 0.06 g/L inhibitor, as well as deionized water.

Suprisingly, it has been found that the intermetallic layer can be completely removed with a stripping solution containing iron-III chloride and one of the above-specified inhibitors without corroding the base metal, whereas solutions containing the same inhibitors and NaCl, $CuCl_2$, or $Fe_2O_3$ instead of iron-III chloride, have a highly corrosive effect on the copper. If $SnCl_4$ is used instead of iron-III chloride, the stripping effect stops on the intermetallic layer. The preferred stripping solution contains from 5 to 8 g/L iron-III chloride, 0.02 to 0.06 g/L inhibitor, and deionized water.

According to the invention, the method can be carried out in a two-step process, in which lead/tin, lead or tin is removed in the first step, and the intermetallic layer is removed in the second step. A typical example of a solution of the invention for use in the first process step has the following composition:

Solution I:
aqueous solution of $HNO_3$, 30% by weight;
F127, 0.03 g/L.

When using the above solution, the etching action is stopped on the intermetallic layer.

Solution II:
iron-III chloride, 7.5 g/L;
F127, 0.02 g/L.

Operating temperature for solutions I and II = 25° C.

According to the preferred implementation of the process, the invention is carried out in a one-step process, in which the aqueous caustic solution contains the inhibitor and nitric acid, as well as iron-III chloride.

EXAMPLE

First, an epoxy/glass base material coated on both sides with copper is provided with the through holes, the walls of which have a metal coating in the finished conductor board, and the walls of the holes are metallized in a well known manner. Subsequently, a plating resist conforming to the negative of the desired conductive pattern is applied to both sides. A lead/tin coating with a thickness of 8 to 10 μm serving as the etch resist is electroplated on the mask-free areas of the copper surface, as well as on the metallized walls of the holes or perforations. The areas of the copper coating not covered by the etch resist are removed by etching in the known manner. Thereafter, the lead/tin etch resist including the intermetallic layer is removed with solution III:

Solution III:
Nitric Acid: 25% by weight;
Iron-III Chloride: 6.5 g/L;
F127: 0.03 g/L;
Deionized water;
Bath temperature = 20°-25° C.
Cauterizing time = 1.5 to 2 minutes.

The high-gloss copper surface remains intact without change. No attack on the copper was found.

Also, the solutions according to the invention can be used in the spray process, in which case it is advantageous if L63 is used as the inhibitor instead of F127.

Solution IV:
Nitric Acid: 30% by weight;
Iron-III chloride: 6 g/L;
L63: 0.03 g/L;
Bath temperature=25° C.
Density=1.136;
pH=<1.

Usefully, the part solutions A and B are prepared first. Part solution A consists of:
200 g/L iron-III chloride
0.25 g/L L63, and
deionized water.

Part solution B consists of:
120 L water and
94 kg (52–53%) nitric acid.

Subsequently, 3.5 L of solution A is added to solution B. The stripping rate for a lead/tin coating amounts to 6 to 8 μm/min; for a tin coating to 4 to 5 μm/min, and for a lead coating to 1.5 to 2 μm/minute.

The stripping vessels or containers are usefully made of PVC, polypropylene, polyethylene, Teflon, or V4A steel. The temperature of 25° C. max. is adjusted with a cooling coil made from titanium or V4A steel. Exhaust ventilation is absolutely required in this operation, but filtration of the solution is not needed.

The capacity of the solution for Sn/Pb (60/40) is about 120 to 140 g/L.

Another suitable solution according to the invention is, by way of example:

Solution V:
Nitric acid: 25–30% by weight;
Iron-III chloride: 5–7 g/L;
FC 95*: 0.03–0/05 g/L;
Deionized water.

What is claimed is:

1. Process for the removal of lead/tin, lead or tin coatings applied to nickel or copper surfaces, by contacting the coatings with an aqueous stripping solution for a period sufficient to remove the coatings from the nickel or copper surfaces, said aqueous stripping solution being characterized in that the stripping solution contains nitric acid and one or several inhibitor(s) selected from the group of block copolymers of propylene oxide and ethylene oxide, fluorocarbon surfactants, polyethylene glycols with a molecular weight more than 2000, and polyols.

2. Process as defined in claim 1, further characterized in that subsequent to removing the lead/tin, lead or tin coating removing an intermetallic intermediate layer, formed at the interface between the nickel or copper base and the lead/tin, lead, or tin coating applied thereto, by contacting the intermetallic layer with an aqueous stripping solution for a time period sufficient to remove the intermetallic layer, said solution containing iron-III chloride and one or several inhibitor(s) selected from the group of block copolymers of propylene oxide and ethylene oxide, fluorocarbon surfactants, polyethylene glycols with a molecular weight of more than 2000, and polyols.

3. Process as defined in claim 1, characterized in that for removing in one step the lead/tin lead or tin coating and an intermetallic intermediate layer formed at the interface between the nickel or copper base and the lead/tin, lead or tin coating applied thereto, said aqueous stripping solution further comprises iron-III chloride.

4. Process as defined in claim 1, characterized in that the aqueous stripping solution is used at a temperature not exceeding 25° C.

5. Process as defined in claim 2, characterized in that the aqueous stripping solution is used at a temperature not exceeding 25° C.

6. Process as defined in claim 3, characterized in that the aqueous stripping solution is used at a temperature not exceeding 25° C.

7. Aqueous stripping solution for the removal of lead/tin, lead or tin coatings applied to nickel or copper surfaces, characterized in that the solution contains nitric acid and one or several inhibitor(s) selected from the group of block copolymers or propylene oxide and ethylene oxide, fluorocarbon surfactants, polyethylene glycols with a molecular weight of more than 2000, and polyols.

8. Aqueous stripping solution for the removal of an intermetallic intermediate layer, formed at the interface between a nickel or copper base and a lead/tin, lead or tin coating applied thereon, characterized in that the solution contains iron-III chloride and one or several inhibitor(s) selected from the group of block copolymers of propylene oxide and ethylene oxide, fluorocarbon surfactants, polyethylene glycols with a molecular weight of more than 2000, and polyols.

9. Aqueous stripping solution for the removal of lead/tin, lead or tin coatings applied to nickel or copper surfaces, and of an intermetallic intermediate layer formed at the interface between the nickel or copper base and the lead/tin, lead or tin coating applied thereto, in one process step, characterized in that the solution contains nitric acid, iron-III chloride and one or several inhibitor(s) selected from the group of block copolymers of propylene oxide and ethylene oxide, fluorocarbon surfactants, polyethylene glycols with a molecular weight of more than 2000, and polyols.

10. Aqueous stripping solution as defined in claim 7, characterized in that such solution contains from 20 to 35% by weight nitric acid, from 0.03 to 0.06 g/L inhibitor, and water.

11. Aqueous stripping solution as defined in claim 8, characterized in that such solution contains from 5 to 8 g/L iron-III chloride, from 0.03 to 0.06 g/L inhibitor, and water.

12. Aqueous stripping solution as defined in claim 9, characterized in that such solution contains from 20 to 35% by weight nitric acid, from 5 to 8 g/L iron-III chloride, from 0.03 to 0.06 g/L inhibitor, and water.

* * * * *

UNITED STATES PATENT AND TRADEMARK OFFICE
CERTIFICATE OF CORRECTION

PATENT NO.   :  4,919,752
DATED        :  April 24, 1990
INVENTOR(S)  :  Gunter Mika It is certified that error appears in the above-identified patent and that said Letters Patent is hereby corrected as shown below:

In the title on the title page, change "LEAD/TIM" to --LEAD/TIN--.

In column 1, in the title, change "LEAD/TIM" to --LEAD/TIN--.

In column 3, line 38, there is an "*" after "FC95". The corresponding footnote has been omitted. Add said corresponding footnote --*a fluorocarbon surfactant--.

Signed and Sealed this

Seventeenth Day of March, 1992

Attest:

HARRY F. MANBECK, JR.

*Attesting Officer*    *Commissioner of Patents and Trademarks*